United States Patent [19]

Sato

[11] Patent Number: 5,726,470

[45] Date of Patent: Mar. 10, 1998

[54] NONVOLATILE SEMICONDUCTOR MEMORY DEVICE AND METHOD OF FABRICATION OF THE SAME

[75] Inventor: Yasuo Sato, Tokyo, Japan

[73] Assignee: Nippon Steel Corporation, Tokyo, Japan

[21] Appl. No.: 607,864

[22] Filed: Feb. 27, 1996

[30] Foreign Application Priority Data

Feb. 28, 1995 [JP] Japan ............................ 7-064958
Feb. 23, 1996 [JP] Japan ............................ 8-061868

[51] Int. Cl.$^6$ ............................................ H01L 29/788
[52] U.S. Cl. ............................... 257/316; 257/315
[58] Field of Search ........................... 257/315, 316, 257/319, 336, 774

[56] References Cited

U.S. PATENT DOCUMENTS

| | | | |
|---|---|---|---|
| 4,161,039 | 7/1979 | Rössler | 257/316 |
| 4,317,273 | 3/1982 | Guterman et al. | 257/315 |
| 4,757,032 | 7/1988 | Contiero | 437/162 |
| 5,079,603 | 1/1992 | Komori et al. | 257/316 |
| 5,235,200 | 8/1993 | Komori et al. | 257/315 |
| 5,553,018 | 9/1996 | Wang et al. | 257/315 |

FOREIGN PATENT DOCUMENTS 54-156483 of 1979 Japan.

*Primary Examiner*—Sara W. Crane
*Assistant Examiner*—Phat X. Cao
*Attorney, Agent, or Firm*—Pollock, Vande Sande & Priddy

[57] ABSTRACT

A nonvolatile semiconductor memory device and a method of fabrication thereof wherein the nonvolatile semiconductor memory device has at least one memory cell transistor of DSA type and an externally-accessible conduction layer electrically connected to the channel region of the transistor.

15 Claims, 12 Drawing Sheets

FIG. IA
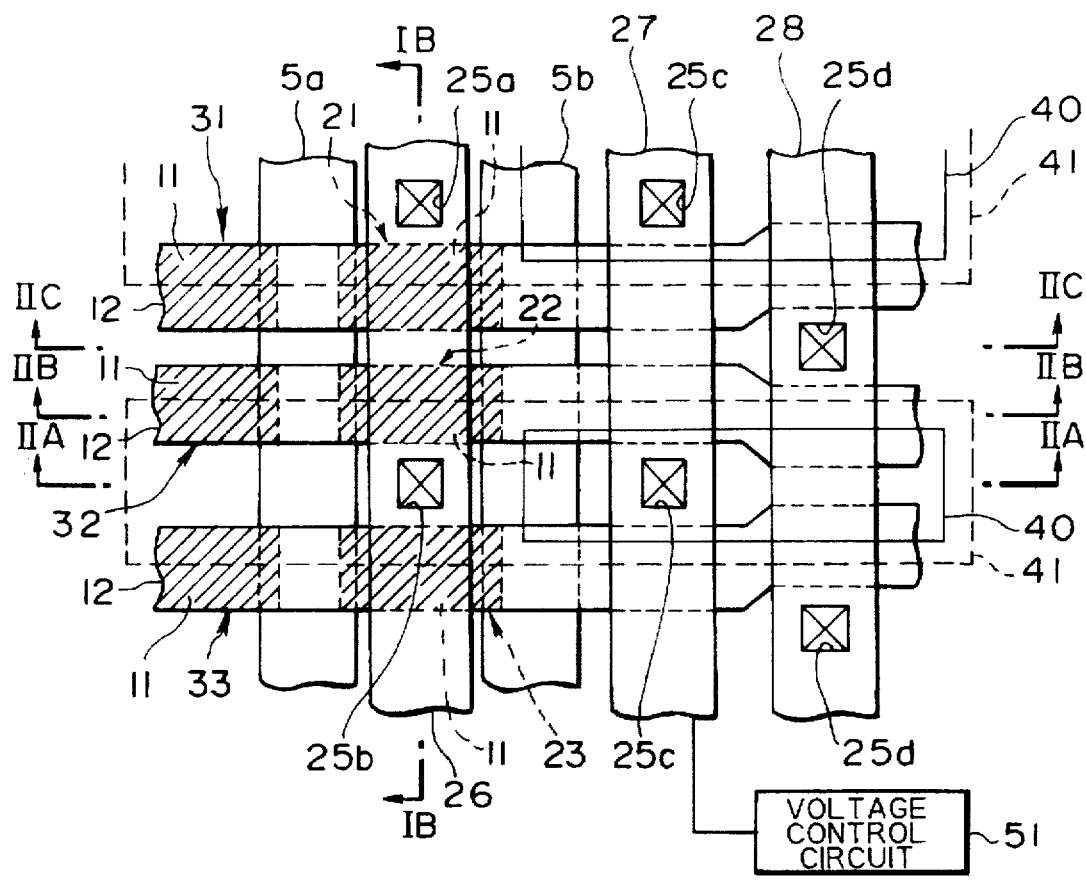
FIG. IB
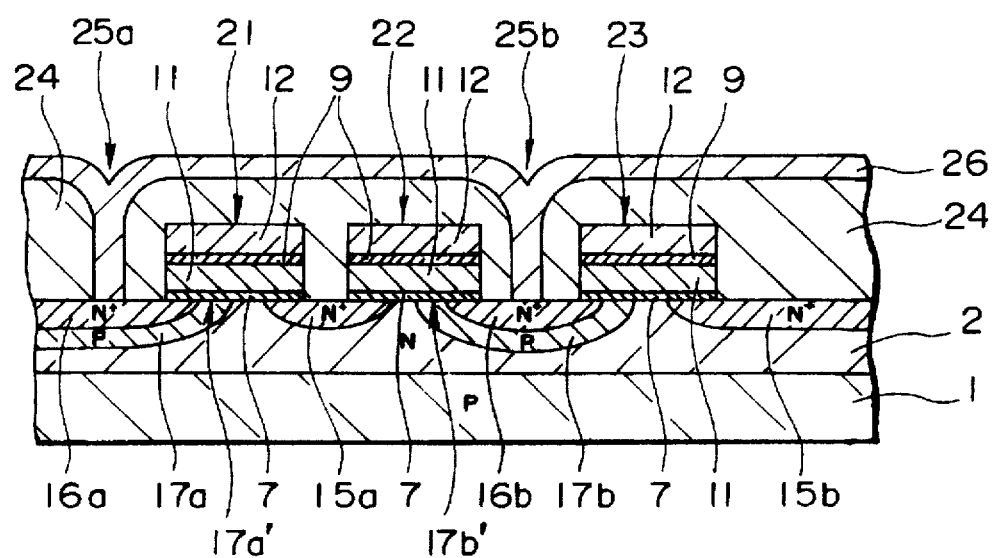

NONVOLATILE SEMICONDUCTOR MEMORY DEVICE AND METHOD OF FABRICATION OF THE SAME

BACKGROUND OF THE INVENTION

1. Field of the Invention

The present invention relates to a nonvolatile semiconductor memory device such as the flash memory or mask ROM and a method of fabrication thereof.

2. Description of the Related Art

The electrically erasable and programmable read-only memory (EEPROM) has the property that data can be electrically written into or erased from a memory cell. This memory is nonvolatile in that data are not erased even when powered off. The flash-type EEPROM (flash memory), in which data are erased by all bits on block or by a unit of one block, can be configured of a single memory transistor for each memory cell unlike the ordinary EEPROM requiring a memory transistor and a selection transistor for each memory cell. The flash memory, therefore, has the advantage that high integration is possible to the same extent as the EPROM (erasable and programmable read-only memory) of ultraviolet erasing type.

In the EEPROM including the flash memory, the effective length of the channel region (effective channel length) defined by the relative positions of the source diffusion layer and the drain diffusion layer of the memory cell transistor has a considerable effect on the memory cell characteristics including the threshold voltage or drain current in data read operation or the write characteristic in data write operation, for example. As a result, large variations of the effective channel length among memory cells would cause correspondingly great variations in the memory cell characteristics, thereby considerably reducing the reliability of the device or the ratio of good articles.

The source diffusion layer and the drain diffusion layer are formed by ion-implanting impurities into a substrate by self-alignment using a stacked gate structure including a control gate and a floating gate as a mask. The effective channel length, therefore, is determined by two factors including the processing accuracy of the floating gate and the control gate and the lateral expansion (lateral diffusion length) of the source diffusion layer and the drain diffusion layer due to the heat treatment after ion implantation.

In the case where the memory size is reduced in order to increase the memory capacity per unit surface area, the accuracy of the effective channel length is largely dependent on the processing accuracy of the floating gate and the control gate rather than on the lateral diffusion length of impurities. The minimum resolution in exposure of the photoresist, etc., however, makes it difficult to form a minute floating gate or the like with high accuracy. Consequently, the effective channel length is considerably varied among memory cells.

In view of this, a memory cell transistor of DSA (diffusion self-alignment) type is proposed for the nonvolatile semiconductor memory device (for example, JP-A-54-156483). In the DSA-type memory cell transistor, the effective channel length is independent of the processing dimensions or accuracy of the floating gate and the control gate but dependent on the difference between the lateral diffusion lengths of P-type and N-type impurities, and therefore the effective channel length is not varied among memory cells.

In the nonvolatile semiconductor memory device described in the above-described patent publication, however, the channel region providing a P-type impurities diffusion layer is sandwiched in a floating state between an N-type substrate and an N-type drain diffusion layer, and therefore the potential of the channel region cannot be controlled. For this reason, both the read or rewrite operations cause a punch-through, with the result that the threshold voltage is varied among memory cells and stable operation becomes difficult.

SUMMARY OF THE INVENTION

The object of the present invention is to provide a nonvolatile semiconductor memory device including a highly reliable DSA-type memory cell transistor which can perform stable read and rewrite operations, and a method of manufacturing such a nonvolatile semiconductor memory device.

According to one aspect of the invention, there is provided a nonvolatile semiconductor memory device comprising: a semiconductor substrate of first conduction type; at least a transistor formed on the semiconductor substrate, including a gate structure formed on a predetermined region of the surface of the substrate, a pair of impurities diffusion layers of first conduction type formed in isolation from each other on the two sides of the gate structure on the surface of the semiconductor substrate, and a second impurities diffusion layer of second conduction type different from the first conduction type, formed in such a manner as to surround one of the impurities diffusion layers and having a terminal section reaching a predetermined region of the surface of the semiconductor substrate, the second impurities diffusion layer forming the channel region of the transistor; and a conduction layer electrically connected to the second impurities diffusion layer and formed in such a manner to be externally accessible.

According to a second aspect of the invention, there is provided a nonvolatile semiconductor memory device comprising: a semiconductor substrate of first conduction type; at least a memory cell transistor formed on the semiconductor substrate, each including a stacked gate structure having a floating gate formed on a predetermined region of the surface of the semiconductor substrate through a first insulating film and a control gate formed on the floating gate through a second insulating film, a pair of first impurities diffusion layers of first conduction type formed in isolation from each other on the two sides of the gate structure on the surface of the semiconductor substrate and having a resistance lower than the semiconductor substrate, and a second impurities diffusion layer of second conduction type different from the first conduction type formed in such a manner as to surround one of the first impurities diffusion layers in the semiconductor substrate, the second impurities diffusion layer having a terminal section reaching a predetermined region of the surface of the semiconductor substrate and forming the channel region of the transistor; an extension of the second impurities diffusion layer extending into the semiconductor substrate; and a conduction layer electrically connected to the extension and formed in such a manner as to be externally accessible.

According to a third aspect of the invention, there is provided a nonvolatile semiconductor memory device comprising: a semiconductor substrate of first conduction type; at least a memory cell transistor formed on the semiconductor substrate, each including a gate electrode formed on a predetermined region of the surface of the semiconductor substrate through an insulating film, a pair of first impurities diffusion layers of first conduction type formed in isolation from each other on the two sides of the gate electrode on the surface of the semiconductor substrate and having a resistance lower than the semiconductor substrate, and a second impurities diffusion layer of second conduction type different from the first conduction type and formed in such a manner as to surround one of the first impurities diffusion layers in the semiconductor substrate, the second impurities diffusion layer having a terminal section reaching a predetermined region of the surface of the semiconductor substrate and constituting the channel region of the transistor; an extension of the second impurities diffusion layer extending into the semiconductor substrate; and a conduction layer electrically connected to the extension and formed in such a manner as to be externally accessible.

According to another aspect of the invention, there is provided a method of fabricating a nonvolatile semiconductor memory device, comprising the steps of: introducing impurities of second conduction type different from the first conduction type into a predetermined region of the semiconductor substrate of first conduction type, heat-treating the impurities of second conduction type thereby to form at least a field oxide film for electrically isolating two element activating regions, and activating the impurities of second conduction type, thereby forming an impurities diffusion layer of second conduction type under the field oxide film; forming a stacked gate having a floating gate formed through a first insulating film on at least one of the two element activating region and a control gate formed on the floating gate through a second insulating film; introducing impurities of first conduction type into regions on the two sides of the stacked gate on the surface of the semiconductor substrate, introducing impurities of second conduction type having a larger diffusion coefficient than the impurities of first conduction type into one of the two regions, heat-treating and thereby activating the impurities of first conduction type and the impurities of second conduction type, forming a pair of first diffusion layers by diffusion of impurities of first conduction type on the two regions, and forming a second diffusion layer by diffusion of impurities of second conduction type surrounding the first diffusion layer in one of the regions and having a terminal section reaching the surface of one of the element activating regions; and forming a conduction layer electrically connected to the extension of the second diffusion layer and accessible externally.

According to still another aspect of the invention, there is provided a method of fabricating a nonvolatile semiconductor memory device comprising a plurality of memory cells, comprising the steps of: introducing impurities of second conduction type different from the first conduction type into a predetermined region of the semiconductor substrate of first conduction type, heat-treating the impurities of second conduction type thereby to form at least a field oxide film for electrically isolating the two element activating regions from each other, and activating the impurities of second conduction type, thereby forming an impurities diffusion layer of second conduction type under the field oxide film; introducing impurities of second conduction type into a plurality of predetermined areas of the element activating regions using a mask of a pattern corresponding to the data to be written in the memory cells; forming a gate structure of the memory cell transistors according to a predetermined pattern in at least one of the two element activating regions; introducing impurities of first conduction type into regions on the two sides of each gate structure of the semiconductor substrate, introducing impurities of second conduction type having a larger diffusion coefficient than the impurities of first conduction type into one of the two regions, and activating and diffusing by heat treatment the impurities of first conduction type and impurities of second conduction type, thereby forming a pair of first diffusion layers by diffusion of the impurities of first conduction type in the two regions and a second diffusion layer by diffusion of the impurities of second conduction type, the second diffusion layer surrounding the first diffusion layer and having a terminal section reaching the surface of the semiconductor substrate; and forming a conduction layer electrically connected to the second diffusion layer and externally accessible.

BRIEF DESCRIPTION OF THE DRAWINGS

FIG. 1A is a plan view showing an arrangement of the essential parts of a flash memory according to a first embodiment of the invention.

FIG. 1B is a sectional view taken in line IB—IB in FIG. 1A.

DESCRIPTION OF THE PREFERRED EMBODIMENTS

A flash memory according to a first embodiment of the invention is described below with reference to the accompanying drawings.

Figure 2A:
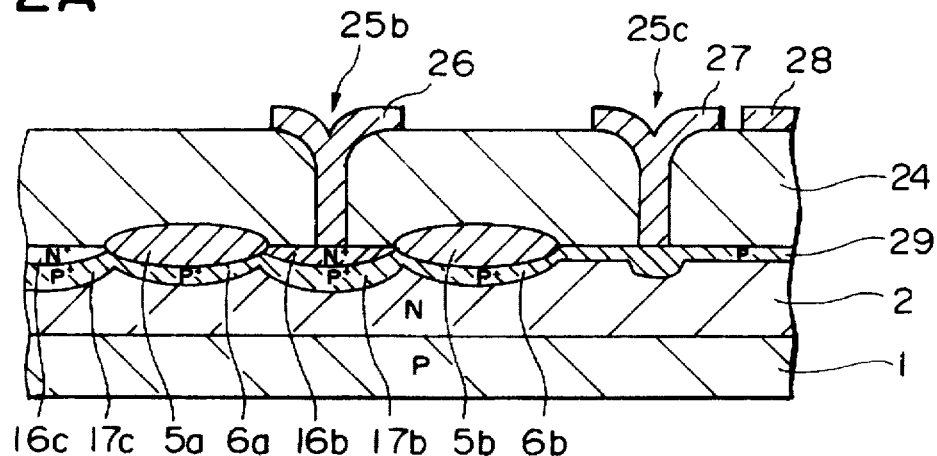
FIGS. 2A to 2C are sectional views taken in lines IIA—IIA, IIB—IIB and IIC—IIC respectively in FIG. 1A.
Figure 2B:
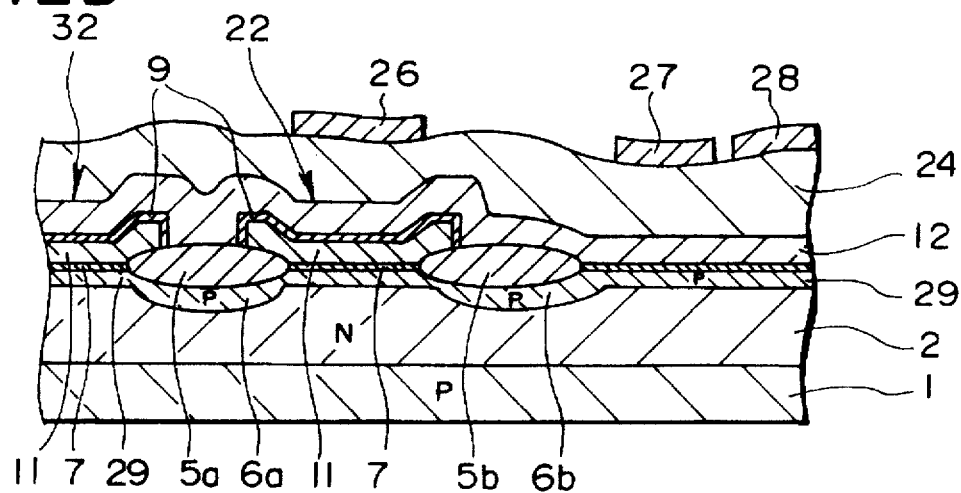
Figure 2C:
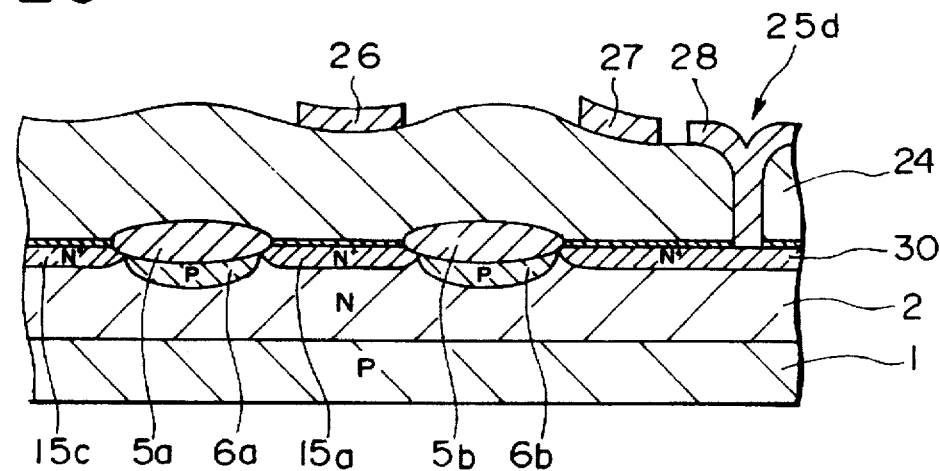

FIG. 1A is a partial plan view of a flash memory according to the first embodiment of the invention. Six memory cells 21 to 23 and 31 to 33 are shown. FIG. 1B is a sectional view taken in line IB—IB in FIG. 1A. FIGS. 2A to 2C are sectional views taken in lines IIA—IIA, IIB—IIB and IIC—IIC respectively in FIG. 1A.

As shown in FIG. 1A, control gates (word lines) of the memory cells 21 to 23 are formed in the direction perpendicular to the length of field oxide films 5a, 5b. Floating gates 11 of the memory cells 21 to 23 are formed respectively on an element-activating region sandwiched between the field oxide films 5a, 5b under each control gate 12, as shown in FIG. 2B. Source diffusion layers 15a, 15b and drain diffusion layers 16a, 16b are formed on the surface of an N-type well 2 of a P-type silicon substrate 1 in the element-activating region, as shown in FIG. 1B.

An interlayer insulating film 24 is formed in such a manner as to cover the memory cells 21 to 23 over the entire surface of the well 2. A bit wiring conduction film 26, a conduction film 27 for channel metal wiring and a conduction line 28 for source wiring (FIGS. 2A to 2C) are formed according to a predetermined pattern in such a manner as to be externally accessible on the interlayer insulating film 24. The bit wiring conduction film 26 is electrically connected to the drain diffusion layers 16a, 16b through contact holes 25a, 25b formed in the interlayer insulating film 24 along the longitudinal direction of the field oxide films 5a, 5b. The channel wiring conduction film 27 is formed extending along the longitudinal direction in parallel to the field oxide film 5b on the opposite side thereof with respect to the conduction film 26. The conduction film 27 is connected to the channel diffusion layers 17a, 17b surrounding the drain diffusion layers 16a, 16b through the contact hole 25c. Also, the channel diffusion layers 17a, 17b have terminal sections 17a', 17b' ending at a region formed with the floating gate on the surface of the well 2. This channel metal wiring 27 is connected to a voltage control circuit 51 for controlling the potential of the channel diffusion layers 17a, 17b. Further, a source wiring 28 arranged in the neighborhood of the channel metal wiring 27 is connected to the source diffusion layers 15a, 15b of the memory cells 21 to 23 and 31 to 33 at the contact hole 25d.

Three memory cells 21 to 23 are plotted in FIG. 1B. These memory cells 21 to 23 are each formed in an N-type well 2 providing a low-concentration N-type impurities diffusion layer about 3 μm in diffusion depth formed on the P-type silicon substrate 1. On the other hand, source diffusion layers 15a, 15b and drain diffusion layers 16a, 16b each constituting an N-type impurities diffusion layer of high-concentration (hence, lower resistance than the N-type well 2) are formed in spaced relation to each other in the neighborhood of the surface of the N-type well 2. A floating gate 11 is formed on the N-type well 2 between the source and drain through a tunnel oxide film 7 about 10 nm thick. Further, a control gate 12 is formed on the floating gate 11 through an ONO film 9 having a thickness of about 25 nm in terms of an oxide film. The source diffusion layer 15 is shared between the memory cells 21 and 22, and the drain diffusion layer 16b is shared between the memory cells 22 and 23.

The drain diffusion layers 16a, 16b are surrounded by P-type channel diffusion layers 17a, 17b higher in concentration than the silicon substrate 1, and electrically insulated and isolated from the N-type well 2. Also, the source diffusion layers 15a, 15b are of the same conduction type as and are electrically connected with the N-type well 2. In other words, the source diffusion layers of all the memory cells formed in the N-type well 2 are electrically connected with each other. Only the P-type channel diffusion layers 17a, 17b are interposed as a heterogeneous conduction layer between the drain diffusion layers 16a, 16b and the source diffusion layers 15a, 15b of each of the memory cells 21 to 23. The effective channel length of the memory cell thus is defined by the width of the channel diffusion layers 17a, 17b, in the neighborhood of the surface of the N-type well 2, i.e., the lateral diffusion length of the channel diffusion layers 17a, 17b. In this way, the memory cells 21 to 23 and 31 to 33 of the flash memory according to this embodiment constitute a DSA-type MOS transistor with the channel diffusion layers 17a, 17b sandwiched between the drain diffusion layers 16a, 16b and the N-type well 2.

The memory cells 21 to 23 are each covered in its entirety by an interlayer insulating film 24. A bit line 26 constituting a metal wiring formed in pattern on the interlayer insulating film 24 is connected to the drain diffusion layers 16a, 16b at the contact holes 25a, 25b respectively formed in the interlayer insulating film 24.

FIG. 2A is a schematic sectional view taken in the drain region between the memory cells 22, 23 and 32, 33. As shown in this FIG. 2A, the channel diffusion layers 17b, 17c, which are in contact with the high-concentration P-type contact diffusion layer 29 and the high-concentration P-type channel-connecting diffusion layers 6a, 6b formed under the field oxide films 5a, 5b, extend integrally with these components in the N-type well 2 out of the region formed with the memory cells. The high-concentration P-type contact diffusion layer 29 is connected to the channel metal line 27 through a contact hole 25c formed in the interlayer insulating film 24. The channel metal wiring 27, as shown in FIG. 1A, is connected to the voltage control circuit 51. As a consequence, the channel diffusion layers 17a, 17b, 17c of the memory cells 21 to 23, 31 to 33 are electrically connected to the voltage control circuit 51, so that the potential of the channel region of the memory cells 21 to 23, 31 to 33 can be controlled independently of the substrate and the like. For the purpose of protecting against alloy spikes or the like, the contact diffusion layer 29 may be formed deep around the bottom of the contact hole 25c.

FIG. 2B is a sectional view schematically showing the gate region of the memory cells 22, 32. As shown in FIG. 2B, the control gate 12 is formed continuously in the memory cells 22, 23. Also, the memory cells 22 and 32 are electrically isolated from each other by the field oxide film 5a, and it is seen that the high-concentration P-type channel-connecting diffusion layer 6a functions as a channel stop layer in this field region.

FIG. 2C is a sectional view schematically showing the source region between the memory cells 21, 22 and 31, 32. As shown in FIG. 2C, a source line 28 is connected to a high-concentration N-type contact diffusion layer 30 at the contact hole 25d. The contact diffusion layer 30 is of the same conduction type as and electrically connected with the N-type well 2. As a result, the source line 28 is connected electrically to the sources of all the memory cells formed in the N-type well through the high-concentration N-type contact diffusion layer 30. In this way, the source potential of the memory cells 21 to 23 and 31 to 33 can be controlled by providing the source line 28 connected with the N-type well 2.

The relative positions of the element-isolating field oxide films 5a, 5b, the bit line 26, the source line 28 and the channel line 27 with respect to the memory cells will be described with reference to FIG. 8.

The memory cells of the nonvolatile semiconductor memory device are arranged in a matrix of rows and columns. The field oxide films 5a, 5b are formed in a plurality of stripes extending in the longitudinal direction, vertical direction, and each field oxide film electrically isolates the two contiguous element-activating regions. In the case of EEPROM, stacked gates of the memory cells of each column are formed in one of the element-activating regions, a plurality of word lines 12 are formed in parallel along the rows perpendicular to the field oxide films 5a, 5b, and each word line is connected to the control gates of the memory cells of one row. The channel regions 17a, 17b of the memory cells of one row, as shown in FIG. 2A, extend to the contact diffusion layer 29 formed in the element-activating region through the channel-connecting diffusion layers 6a, 6b formed under the field oxide films 5a, 5b. The contact diffusion layer 29 is connected to a common channel wiring conduction film 28 through a contact hole formed in the interlayer insulating film. The channel diffusion layers 17a, 17b of all the memory cells of one row can also be connected to a common channel wiring conduction film 28. With the increase in the number of memory cells of a block connected to a common channel line, however, the potential drop due to the line resistance increases. The number of memory cells for each column of a block is preferably limited to an appropriate value of, say, 4 or 8. In FIG. 8, each block has five element-activating regions defined by four field oxide films (5a1, 5b1, 5a2, 5b2), and the channel diffusion layers of four memory cells formed in four of the element-activating regions are connected to a common channel line 27 through the contact diffusion layer 29 formed in the remaining one element-activating region. As a result, the number of memory cells for each block is 4 per column in FIG. 8, which may be set to an appropriate number of, say, 8 or 16. Although the number of memory cells per row of a block is not specifically limited, the number of memory cells per column of a block may be limited for the convenience of control. In the case of FIG. 8, the number of memory cells per column is limited to 4 with the range of each block along the column set to A, but the number of memory cells per row, however, is not limited. In other words, in the configuration of FIG. 8, the range of each block along the row is A, and a plurality of configurations similar to A are arranged in parallel along the row in the whole memory device. On the other hand, a configuration B is repeated along the column of each block.

A common source wire 28 is provided for each block. The source diffusion layers 15a, 15b of the memory cells on a row of a block are connected through an N-type well to the contact diffusion layer 30, which in turn is connected to a common source wiring 28 through the contact hole 25d formed in the interlayer insulating layer 24. One drain line 26 is provided for each column per block, and the drain diffusion layer 16a or 16b of the memory cells of each column is connected to a corresponding drain line 26 through the contact holes 25a, 25b.

Figure 8:
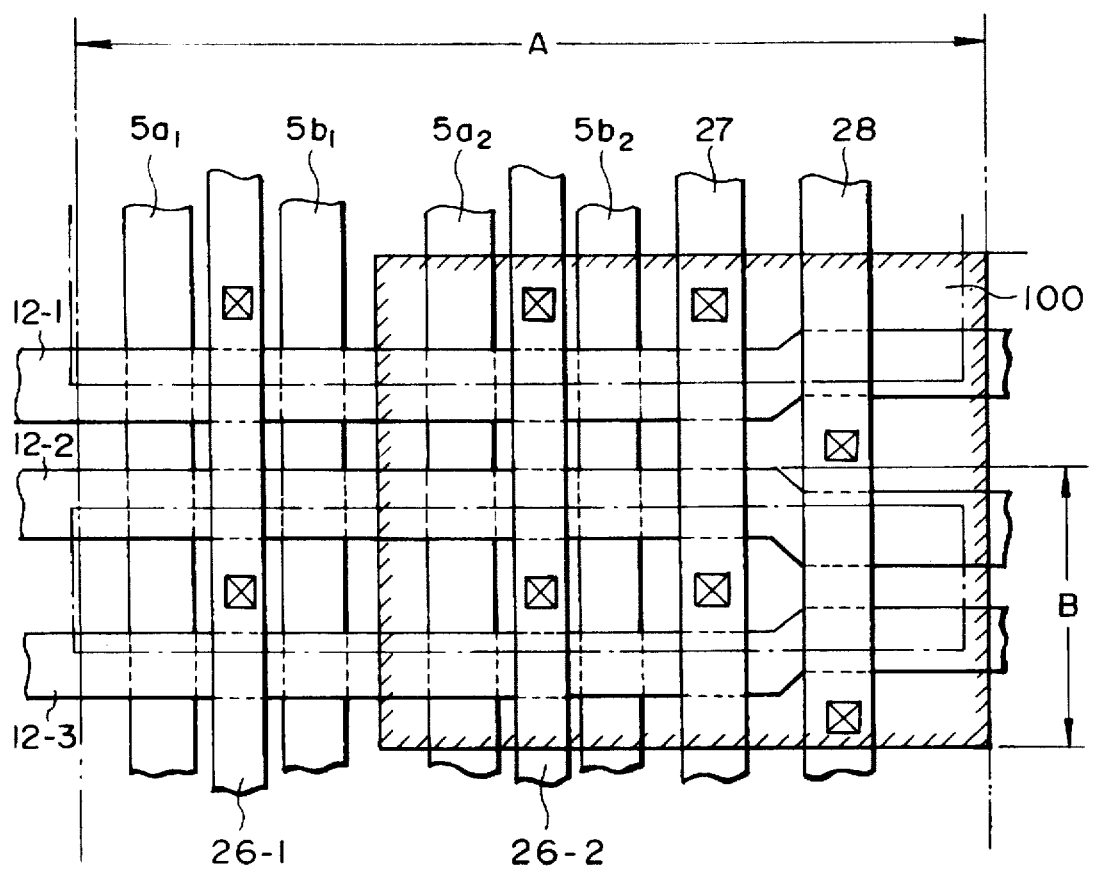
FIG. 8 is a plan view schematically showing an arrangement of an element-isolating field oxide film, a bit line, a source line and a channel-connecting line of a nonvolatile semiconductor memory device according to the invention.

FIG. 1A is a diagram showing a detailed configuration of a region 100 defined by a line with hatches in FIG. 8.

Now, a method of fabricating a flash memory according to this embodiment will be described with reference to FIGS. 3A to 3G and 4A to 4D. FIGS. 3A to 3G are sectional views similar to FIG. 1B, and FIGS. 4A to 4D sectional views similar to FIG. 2A.

Figure 3A:
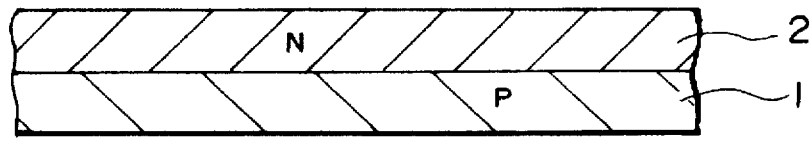
FIGS. 3A to 3G are sectional views corresponding to FIG. 1B, representing each step of a method of fabricating a flash memory according to the first embodiment of the invention.

First, as shown in FIG. 3A, N-type impurities of phosphorus or the like are ion-implanted with a dose of about $1\times10^{13}/cm^2$ and an acceleration voltage of about 50 keV. This step is followed by heat treatment for about 6 hours in a nitrogen environment of about 1050° C. in temperature thereby to form an N-type well 2 in the surface of the silicon substrate 1.

Figure 4A:
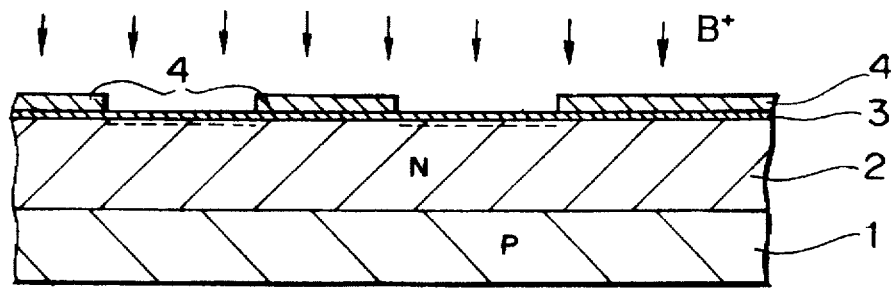
FIGS. 4A to 4D are sectional views corresponding to FIG. 2A, representing each step of a method of fabricating a flash memory according to the first embodiment of the invention.

As the next step, as shown in FIG. 4A, a silicon oxide film 3 about 20 nm thick is formed on the N-type well 2, and a silicon nitride film 4 about 40 nm thick is formed on the silicon oxide film 3. The silicon nitride film 4 is selectively etched off by fine processing using a photoresist (not shown) in such a manner as to leave the silicon nitride film 4 intact only in the areas where the element regions are to be formed. Then, with the remaining pattern of the silicon nitride film 4 as a mask, P-type impurities of boron or the like are ion-implanted into the N-type well 2 with a dose of about $1\times10^{13}/cm^2$ and an acceleration voltage of about 20 keV.

Figure 4B:
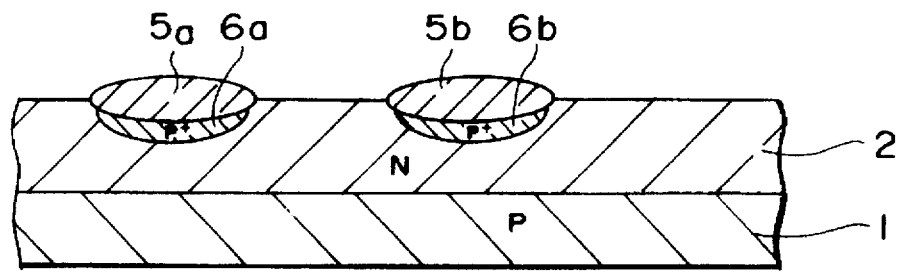

As the next step, as shown in FIG. 4B, field oxide films 5a, 5b are formed in the thickness of about 450 to 600 nm on the N-type well 2 by the LOCOS method with the silicon nitride film 4 as an antioxidation mask. At the same time, high-concentration P-type channel-connecting diffusion layers 6a, 6b are formed under the field oxide films 5a, 5b, after which the silicon nitride film 4 is removed, followed by removing the silicon oxide film 3 in the surface of the element region surrounded by the field oxide films 5a, 5b.

Figure 3B:
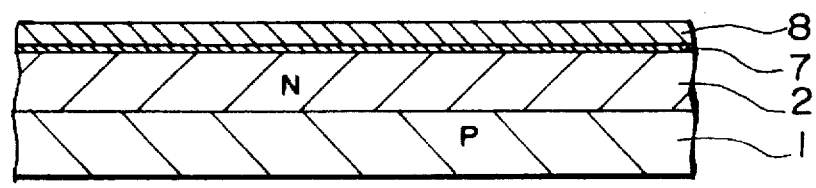

Then, as shown in FIG. 3B, a tunnel oxide film 7 about 10 nm thick is formed by thermal oxidation, further followed by forming a polycrystal silicon film 8 about 100 to 200 nm thick by the CVD method on the tunnel oxide film 7. After that, impurities of phosphorus or the like in the thickness of about $1\times10^{18}/cm^3$ are introduced into the polycrystal silicon film 8, after which the polycrystal silicon film 8 is selectively etched off by fine processing using a photoresist (not shown). Then, the polycrystal silicon film 8 is divided for the respective memory cells in the direction along the control gate to be formed. (See the shape of the floating gate 11 shown in FIG. 2B.)

Figure 3C:
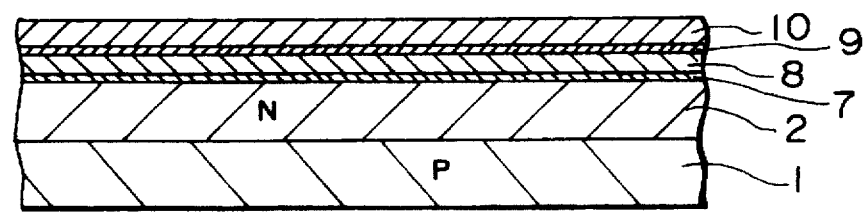

As the next step, as shown in FIG. 3C, an ONO film 9 of a thickness equivalent to about 25 nm thick of oxide film and including a silicon oxide film, a silicon nitride film and another silicon oxide film deposited in that order is formed over the entire surface by a combination of thermal oxidation and CVD processes. Instead of the ONO film 9, other dielectric film such as a silicon oxide film only or an ONON film may be used. After that, a polycrystal silicon film 10 about 100 to 200 nm thick is formed over the entire surface, and impurities of phosphorus or the like in the concentration of about $1\times10^{20}/cm^3$ are introduced into the polycrystal silicon film 10. According to the embodiment under consideration, the polycrystal silicon films 8 and 10 are used as a conduction film of the gate structure. The polycrystal silicon film, however, may be replaced with equal effect by a Ti film about 100 to 200 nm thick or a polycide film composed of a Ti silicide film and a polycrystal silicon film each about 150 nm thick.

Figure 3D:
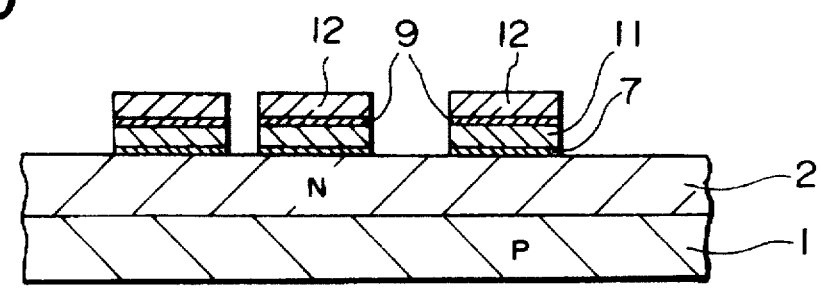

Next, as shown in FIG. 3D, a photoresist (not shown) is coated over the entire surface and then formed into a pattern of control gates. With the photoresist thus patterned as a mask, the polycrystal silicon film 10, the ONO film 9, the polycrystal silicon film 8 and the tunnel oxide film 7 are selectively etched off, after which the photoresist is removed. As a consequence, a composite gate composed of the floating gate 11, the ONO film 9 and the control gate 12 is formed.

Figure 3E:
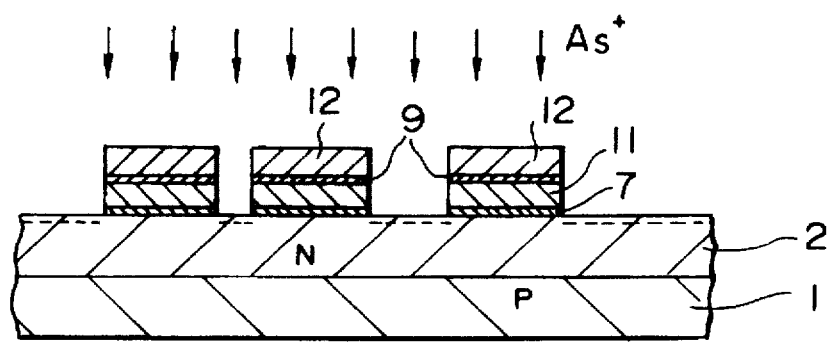
Figure 4C:
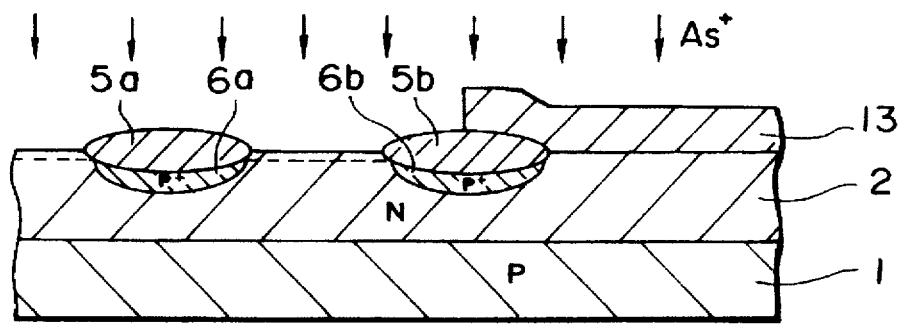

As the next step, as shown in FIGS. 3E and 4C, the photoresist 13 is applied over the entire surface, and then the photoresist 13 is patterned into a pattern of a region 40 shown in FIG. 1A, that is, into a pattern covering the region having the contact hole 25c. With the field oxide films 5a, 5b and the photoresist 13 thus patterned as a mask, N-type impurities of arsenic or the like are ion-implanted into the N-type well 2 with an acceleration voltage of about 40 keV and a dose of about $5\times10^{15}/cm^2$. In the process, the N-type impurities thus ion-implanted are diffused by subsequent heat treatment, thereby forming the source diffusion layers 15a, 15b, the drain diffusion layers 16a, 16b and the high-concentration N-type contact diffusion layer 30 of each memory cell. In the case where phosphorus ions are implanted as N-type impurities, deeper ion implantation is possible under the same ion implantation conditions.

Figure 3F:
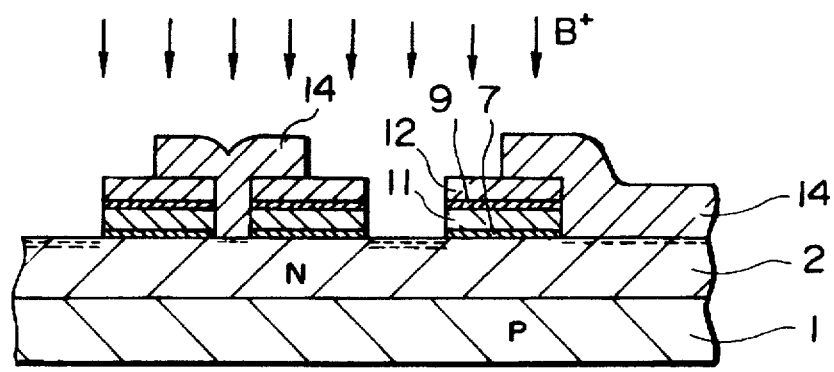
Figure 4D:
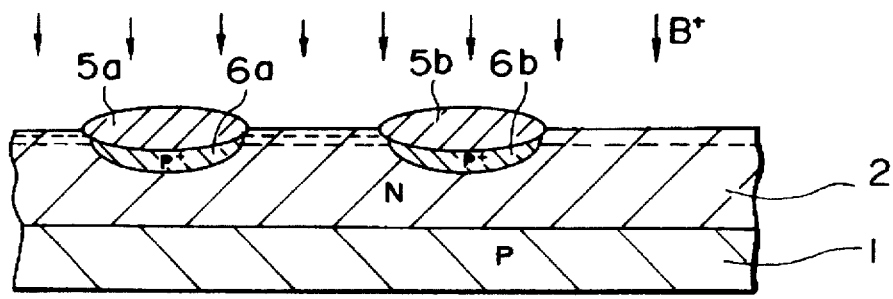

As the next step, as shown in FIGS. 3F and 4D, the photoresist 13 is removed, and the photoresist 14 is applied over the entire surface, and the photoresist 14 is patterned into a pattern excluding the region 41, i.e., a pattern in which one of two regions of N-type well 2 at both sides of each control gate is exposed. With the field oxide films 5a, 5b and the photoresist 14 thus patterned as a mask, P-type impurities of boron or the like, for example, are ion-implanted into the N-type well 12 with a dose of about $5 \times 10^{14}/cm^2$. In the process, the P-type impurities ion-implanted are diffused by subsequent heat treatment, thereby forming a high-concentration P-type contact diffusion layer 29 and the channel diffusion layers 17a, 17b surrounding the drain diffusion layers 16a, 16b respectively of each memory cell. After that, the photoresist 14 is removed. The process of ion-implanting the N-type impurities described with reference to FIGS. 3E and 4C and the process of ion-implanting the P-type impurities described with reference to FIGS. 3F and 4D may be interchanged in sequence.

Figure 3G:
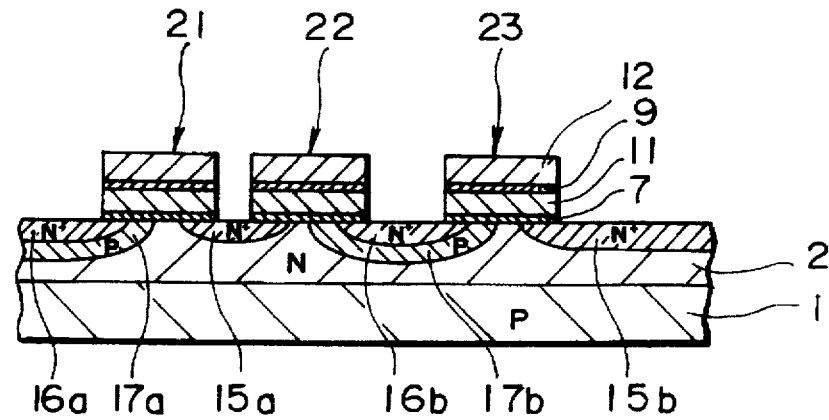

Then, as shown in FIG. 3G, heat treatment is conducted for about 30 minutes in a nitride environment of about 950° C. in temperature, thereby diffusing the boron and arsenic ion-implanted in the N-type well 2 of the element region. At the same time, the source diffusion layer 15a shared by the memory cells 21, 22, the source diffusion layer 15b of the memory cell 23, the drain diffusion layer 16a of the memory cell 21, the drain diffusion layer 16b shared by the memory cells 22 and 23 and the high-concentration N-type contact diffusion layer 30 are formed by arsenic diffusion. Because the diffusion coefficient of boron is considerably larger than that of arsenic, on the other hand, there are formed P-type channel diffusion layers 17a, 17b and a high-concentration P-type contact diffusion layer 29 surrounding the drain diffusion layers 16a, 16b respectively.

More specifically, the drain diffusion layers 16a, 16b are formed by self-alignment with respect to the floating gate 11 and the control gate 12 and are electrically isolated from the N-type well 2 by the channel diffusion layers 17a, 17b. The range in which the channel diffusion layers 17a, 17b are formed is dependent to a large measure on the difference in diffusion coefficient between arsenic and boron and the heat treatment conditions at the time of diffusion. Therefore, such a range can be controlled substantially independent of the processing dimensions and accuracy of the floating gate 11 and the control gate. The channel diffusion layers 17a, 17b and the high-concentration P-type contact diffusion layer 29 formed in this process are integrally connected with the channel-connecting diffusion layers 6a, 6b formed in the steps shown in FIG. 4B.

After this process, as shown in FIG. 1B, an interlayer insulating film 24 composed of PSG and BPSG is formed over the entire surface in such a manner as to cover the whole of the floating gate 11 and the control gate 12. The interlayer insulating film 24 is selectively etched off, thereby forming contact holes 25a, 25b reaching the drain diffusion layers 16a, 16b respectively, a contact hole 25c (FIG. 2A) reaching the high-concentration P-type contact diffusion layer 29, and a contact hole 25d (FIG. 2C) reaching the high-concentration N-type contact diffusion layer 30. The result is forming a bit wiring 26 connecting to the drain diffusion layers 16a, 16b at the contact holes 25a, 25b respectively, a channel metal wiring 27 connected to the contact diffusion layer 29 at the contact hole 25c and the source diffusion layer line 28 connected to the contact diffusion layer 30 at the contact hole 25d. In a region not shown, the channel metal wiring 27 is connected with the voltage control circuit 51. The material of the wirings 26, 27, 28 is preferably Al-Si-Cu, but may be Ti, W, Al or the like.

According to this embodiment, the channel diffusion layers 17a, 17b, 17c, the high-concentration P-type channel-connecting diffusion layers 6a, 6b and the high-concentration P-type contact diffusion layer 29 are continuously formed by being extended in the N-type well 2. In view of the fact that the P-type impurities diffusion layer thus formed continuously is connected to the channel metal wiring 27 through the contact hole 25c in the high-concentration P-type contact diffusion layer 29 constituting an extension of each memory cell, the channel diffusion layers 17a, 17b, 17c are electrically connected with the voltage control circuit 51. As a consequence, the potential of the channel diffusion layers 17a, 17b, 17c of the memory cells 21 to 23 and 31 to 33 can be controlled independently of the substrate or the like without setting them in a floating state. Thus, the threshold voltage is not varied among memory cells which otherwise might be caused by a punch-through at the time of performing the read or rewrite operation. A highly reliable, stable operation thus is made possible.

Also, according to this embodiment, the high-concentration P-type channel-connecting diffusion layers 6a, 6b formed under the field oxide films 5a, 5b are brought into contact with the channel diffusion layers 17a, 17b, 17c, so that these elements are regarded as an electrically integrated impurities diffusion layer. Thus the high-concentration P-type channel-connecting diffusion layers 6a, 6b can be made to function as a channel stopper. At the same time, the channel regions of a plurality of memory cells element-isolated by the field oxide films 5a, 5b can be collectively controlled. As a consequence, the element-isolating capability is improved while simplifying the structure for controlling the potential of the channel region.

With the flash memory according to this embodiment, the high-concentration P-type channel-connecting diffusion layers 6a, 6b can be formed in the process of forming a normal channel stopper. The high-concentration P-type contact diffusion layer 29 can thus be formed at the same time as the channel diffusion layers 17a, 17b, 17c, with the same number of steps as for a flash memory having a memory cell transistor of DSA structure.

According to the present embodiment, the width of the channel diffusion layers 17a, 17b formed in such a manner as to surround the drain diffusion layers 16a, 16b respectively at the N-type well 2 defines the effective channel length of each memory cell. The width of the channel diffusion layers 17a, 17b, which is dependent to a large measure solely on the lateral diffusion length of impurities which is not substantially varied, can be controlled independently of the accuracy and the processing dimensions of the floating gate 11. The effective channel length therefore is not substantially varied among the memory cells 21 to 26, with the result that the variations of the memory characteristics are greatly reduced for a remarkable improvement of device reliability and the ratio of good products. Also, since the drain diffusion layers 16a, 16b are covered by the high-concentration P-type channel diffusion layers 17a, 17b, the writing operation using hot carriers at the drain diffusion layers 16a, 16b, can be performed at a sufficiently high speed while at the same time preventing the punch-through.

Now, the rewrite operation of the flash memory according to this embodiment will be described with reference to the memory cell 21 shown in FIG. 1B. In the description that follows, Vcg designates the voltage applied to the control gate 12, Vd the voltage applied to the drain diffusion layer 16a, Vs the voltage applied to the N-type well 2 and the source diffusion layer 15a, and Vch the voltage applied to the channel diffusion layer 17a.

First, for data to be written into the memory cell 21, Vcg is biased to 12 V, Vd to 6 V, and Vg and Vch, which are equal to each other, to 0 V. Then, electrons acting as minority carriers are induced in the channel diffusion layer 17a at the portion directly under the gate, and the particular portion of the channel diffusion layer 17a that has thus far been P type is turned to N type. Conduction thus occurs between the source diffusion layer 15a and the drain diffusion layer 16a, while the electrons accelerated at the pinch-off region in the neighborhood of the drain diffusion layer of the channel diffusion layer 17a are implanted into the floating gate 11 as hot electrons. As a result, excessive electrons are stored in the floating gate 11, so that the threshold voltage of the memory cell 21, which was about 2 V, for example, at the initial time immediately after fabrication or in electrically erase mode, changes to about 7 V. The memory cell 21 is thus turned to write mode.

For the data stored in the memory cell 21 to be erased, Vg is biased to 12 V, and Vcg, which is the same as Vch, to 0 V, while setting Vd in a floating (open) mode. Then, the excessive electrons as stored in the floating gate 11 are drawn to the source diffusion layer 15a and the N-type well 2 by the current (tunnel current) caused by the Fowler-Nordheim tunneling effect through the tunnel oxide film 7 of the overlapped portion of the floating gate 11, the source diffusion layer 15a and the N-type well 2. Consequently, the threshold voltage of the memory cell 21 changes from about 7 V to about 2 V, and the memory cell 21 is set to erase mode.

For reading the data stored in the memory cell 21, Vcg is biased to 5 V, Vd to 1 V, and Vg, which is the same as Vch, to 0 V in order to prevent implantation of hot electrons into the floating gate 11. Whether the memory 21 is in write or erase mode is determined depending on the presence or absence of drain current.

Now, the rewrite operation in the case where a negative voltage can be used as an internal power supply for the flash memory according to the present embodiment will be described with reference to the memory cell 21, for example. The operation for writing data is the same as that described above and will not be described.

In order to erase the data stored in the memory cell 21 using a negative voltage as an internal power supply, Vs is biased to 7 V, Vcg to −8 V, and Vch to 0 V, while setting Vd in a floating (open) mode. Then, the excessive electrons that have been stored in the floating gate 11 are drawn to the source diffusion layer 15a and the N-type well 2 by the current (tunnel current) due to the Fowler-Nordheim tunneling effect through the tunnel oxide film 7 at the overlapped portion of the floating gate 11, the source diffusion layer 15a and the N-type well 2. As a consequence, the threshold voltage of the memory cell 21 changes from about 7 V to about 2 V, so that the memory cell 21 is set to erase mode.

In this way, with the flash memory according to this embodiment, the potential at the channel diffusion layer 17a can be controlled, and therefore data can be erased using a negative voltage. In this case, the voltage applied between the source diffusion layer 15a and the channel diffusion layer 17a is reduced thereby to reduce the junction leak current. As a result, less carriers are trapped in the tunnel oxide film 7, thereby preventing the reduction in the reliability in terms of the data-holding capability of the memory cell 21 which otherwise might be caused by the stress due to data rewrite operation.

Now, a second embodiment of the invention as applied to a mask ROM of ion-implantation programming type will be described with reference to FIGS. 5 to 7 and FIGS. 4A to 4D used in the first embodiment.

Figure 5A:
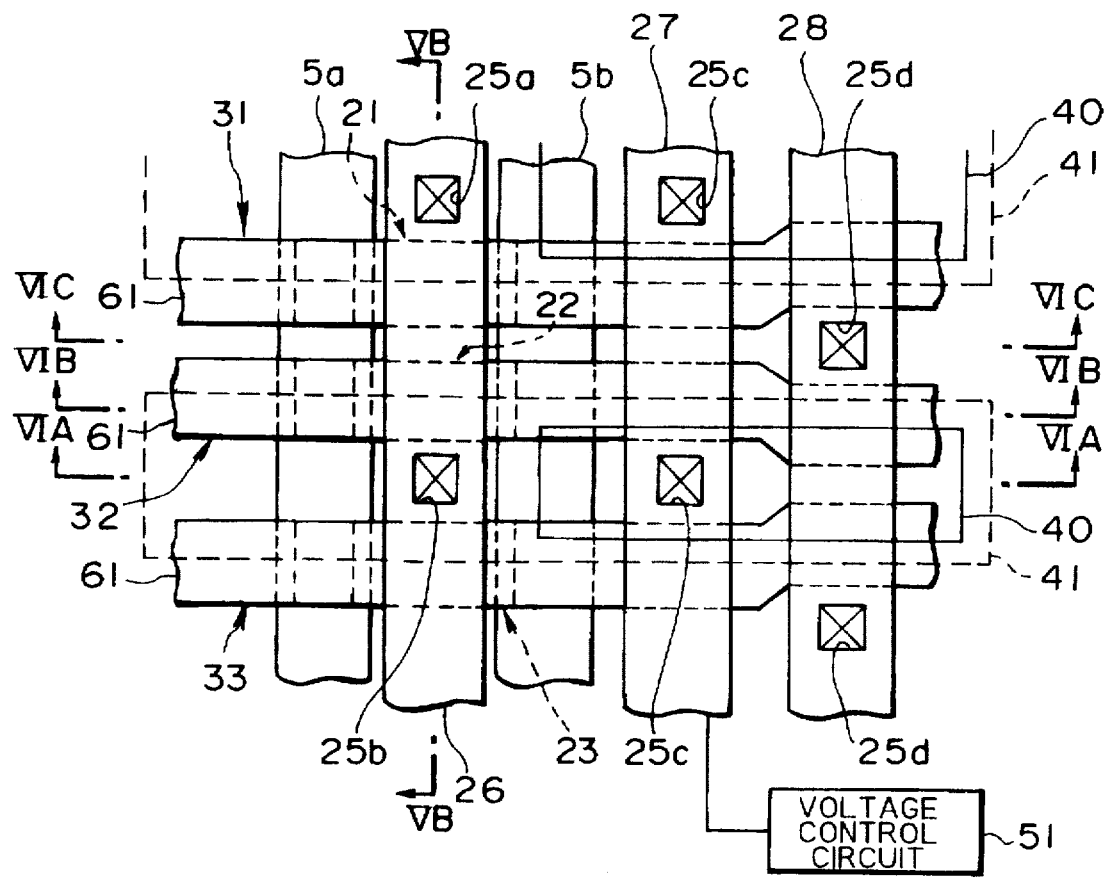
FIG. 5A is a plan view showing an arrangement of the essential parts of a mask ROM according to a second embodiment of the invention.
Figure 5B:
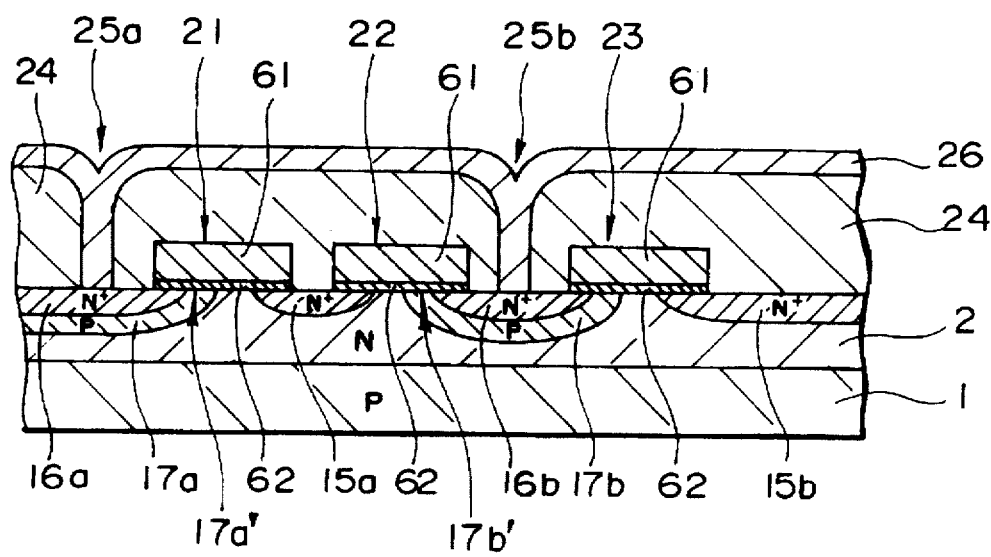
FIG. 5B is a sectional view taken in line VB—VB in FIG. 5A.
Figure 6A:
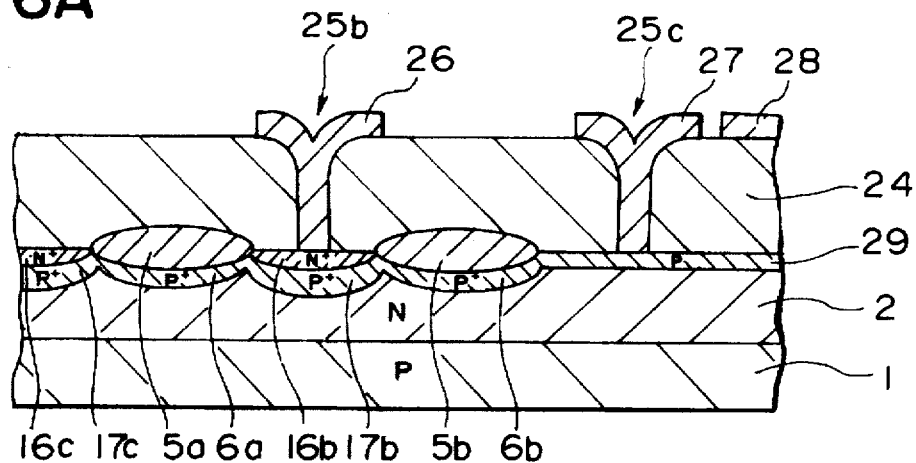
FIGS. 6A to 6C are sectional views taken in lines VIA—VIA, VIB—VIB and VIC—VIC respectively in FIG. 5A.
Figure 6B:
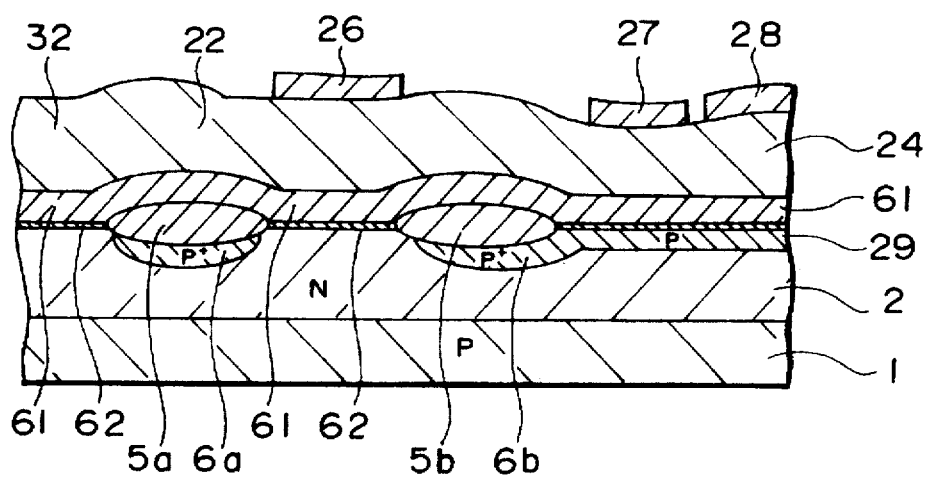
Figure 6C:
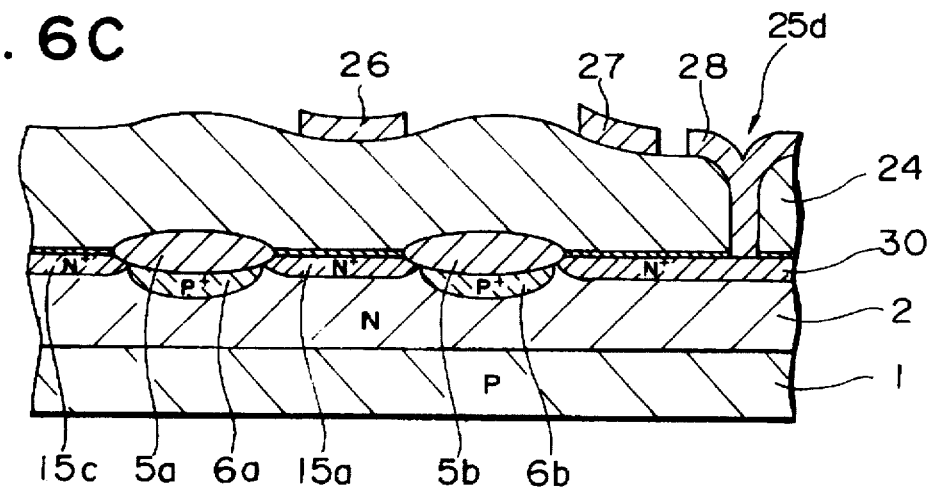

FIG. 5A is a partial plan view of a mask ROM according to the second embodiment of the invention. Six memory cells 21 to 23 and 31 to 33 are shown. FIG. 5B is a sectional view taken in line VB—VB in FIG. 5A. FIGS. 6A to 6C are sectional views taken in lines VIA—VIA, VIB—VIB and VIC—VIC respectively in FIG. 5A. In the embodiment under consideration, the same component parts as the corresponding parts in the first embodiment are designated by the same reference numerals as those in the first embodiment and will not be further described.

As shown in FIG. 5A, gate electrodes (word lines) 61 of the memory cells 21 to 23 are each formed along the direction perpendicular to longitudinal direction of the field oxide films 5a, 5b. As shown in FIGS. 5A and 5B, a channel metal wiring 27 connected to the channel diffusion layers 17a, 17b (FIG. 5B) surrounding the drain diffusion layers 16a, 16b at the contact hole 25c is formed on the opposite side of the field oxide film 5b with respect to the bit wiring 26 (FIG. 6A). The channel diffusion layers 17a, 17b have terminal sections 17a', 17b' ending at a region of the well 2 with the gate 61 formed thereon. This channel metal wiring 27 is connected to a voltage control circuit 51 for controlling the potential of the channel diffusion layers 17a, 17b.

Three memory cells 21 to 23 are plotted in FIG. 5B. These memory cells 21 to 23 include the source diffusion layers 15a, 15b and the drain diffusion layers 16a, 16b each constituting an N-type impurities diffusion layer high in concentration (hence, low in resistance as compared with the N-type well 2) formed in spaced relation to each other in the neighborhood of the surface of the N-type well 2, and at least a gate electrode 61 formed on the N-type well 2 at an area between the source and drain through the interposed gate oxide film 62 at about 30 to 50 nm thick. Only the P-type channel diffusion layers 17a, 17b exist as a heterogeneous conduction type layer between the source diffusion layers 15a, 15b and the drain diffusion layers 16a, 16b of each memory cell 21 to 23. The effective channel length of the memory cell, therefore, is defined by the width of the channel diffusion layers 17a, 17b, i.e., the lateral diffusion length of the channel diffusion layers 17a, 17b in the neighborhood of the surface of the N-type well 2. In this way, the memory cells 21 to 23 and 31 to 33 of the mask ROM according to this embodiment constitute an MOS transistor of DSA type with the channel diffusion layers 17a, 17b sandwiched between the drain diffusion layers 16a, 16b and the N-type well 2.

Also, the impurities concentration of the channel diffusion layers 17a, 17b is set according to the data written into the respective memory cells 21 to 23 (storage condition). An arrangement is made such that in the case where data "0" is written in the memory cell 22 and data "1" is written in the memory cell 23, for example, the impurities concentration of the channel diffusion layer 17b is relatively low at its side closer to the memory cell 22 and relatively high at its other side closer to the memory cell 23. In this way, the threshold voltage level of each of the memory cells 21 to 23 can be controlled by setting the level of impurities concentration of the channel diffusion layers 17a, 17b differently for different locations. Predetermined data ("0" or "1") can thus be written in each of the memory cells 21 to 23.

FIG. 6A is a sectional view schematically showing the drain region between the memory cells 22, 23 and 32, 33. As shown in FIG. 6A, the channel diffusion layers 17b, 17c, which are in contact with the high-concentration P-type channel-connecting diffusion layers 6a, 6b and the high-concentration P-type contact diffusion layer 29 formed under the field oxide films 5a, 5b, extend integrally with these diffusion layers in the N-type well 2 out of the region formed with the memory cells. The high-concentration P-type contact diffusion layer 29 is connected to the channel metal wiring 27 through the contact hole 25c formed in the interlayer insulating film 24. This channel metal wiring 27, as shown in FIG. 5A, is connected to the voltage control circuit 51. As a result, the channel diffusion layers 17a, 17b, 17c of the memory cells 21 to 23 and 31 to 33 are electrically connected to the voltage control circuit 51. In this way, it is made possible to control the potential of the channel region of the memory cells 21 to 23 and 31 to 33 independently of the substrate. The portion of the contact diffusion layer 29 around the bottom of the contact hole 25c may be formed sufficiently deep to protect against alloy spikes.

FIG. 6B is a sectional view schematically showing the gate region of the memory cells 22, 32. As shown in FIG. 6B, a gate electrode 61 is formed continuously at the memory cells 22, 32. Also, the memory cells 22, 32 are electrically isolated from each other by the field oxide film 5a, and it is seen that the high-concentration P-type channel-connecting diffusion layer 6a functions as a channel stop layer for this field region.

FIG. 6C is a sectional view schematically showing the source region between the memory cells 21, 22 and 31, 32. As shown in FIG. 6C, the source line 28 is connected to the high-concentration N-type contact diffusion layer 30 at the contact hole 5d. This contact diffusion layer 30 is of the same time as and is electrically connected to the N-type well 2. Consequently, the source line 28 is electrically connected to the sources of all the memory cells formed in the N-type well 2 through the high-concentration N-type contact diffusion layer 30. In this way, the source potential of the memory cells 21 to 23 and 31 to 33 can be controlled by providing the source line 28 connected to the N-type well 2. The layout of the various wirings in FIG. 8 is equally applicable to the embodiment under consideration.

Now, a method of fabricating a mask ROM according to the present embodiment will be described with reference to FIGS. 8 to 9 and 5. FIGS. 7A to 7G are sectional views similar to FIG. 5B, and FIGS. 4A to 4D and 6A sectional views similar to FIG. 6A.

Figure 7A:
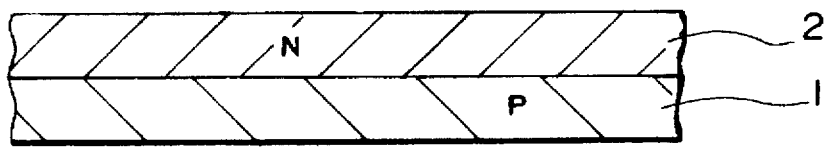
FIGS. 7A to 7G are sectional views corresponding to FIG. 5B, representing each step of a method of fabricating a mask ROM according to the second embodiment of the invention.

First, as shown in FIG. 7A, N-type impurities of phosphorus or the like are ion-implanted in the P-type silicon substrate 1 with an acceleration voltage of about 50 kev and a dose of about $1\times10^{13}/cm^2$. After that, the assembly is heat treated for about 6 hours in a nitrogen environment of about 1050° C. in temperature, thereby forming an N-type well 2 in the surface portion of the silicon substrate 1.

Next, as shown in FIGS. 4A to 4B, the field oxide films 5a, 5b and the high-concentration P-type channel-connecting diffusion layers 6a, 6b are formed by the same process as in the first embodiment.

Figure 7B:
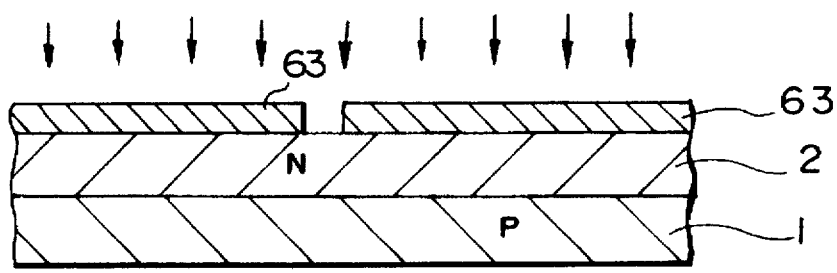

Then, as shown in FIG. 7B, P-type impurities of boron or the like are introduced into the N-type well 2 with an acceleration energy of 20 keV and a dose of about $5\times10^{14}/cm^2$ by ion implantation using a mask composed of a photoresist 63 patterned to the shape corresponding to the data to be written in each of the memory cell transistors 21 to 23. In the case of writing data "0" into the memory cell 22 and data "1" into the memory cells 21, 23, for example, the patterning is effected in such a manner as to retain the photoresist 63 intact in the region formed with the memory cells 21, 23 while at the same time removing the photoresist 63 in the region formed with the memory cell 22 constituting a terminal section (designated by 17b' in FIG. 5B) where the channel diffusion layer terminates at a region of the surface of the well 2 with the gate 61 formed thereon. This ion implantation increases the concentration of the P-type impurities in the region formed with the memory cell 22 as compared with the concentration in the other regions.

Figure 7C:
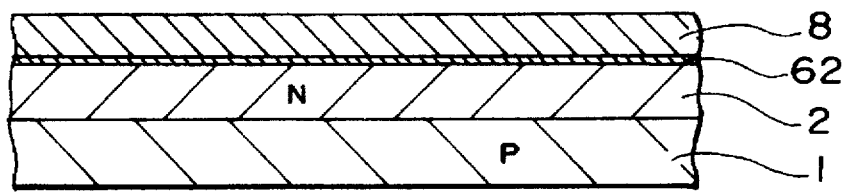

Next, as shown in FIG. 7C, a gate oxide film 62 about 40 nm thick is formed by thermal oxidation, and further a polycrystal silicon film 8 about 100 to 200 nm thick is formed by the CVD process on the gate oxide film 62. After that, impurities of phosphorus or the like with a concentration of about $1\times10^{18}/cm^3$ are introduced into the polycrystal silicon film 8.

Figure 7D:
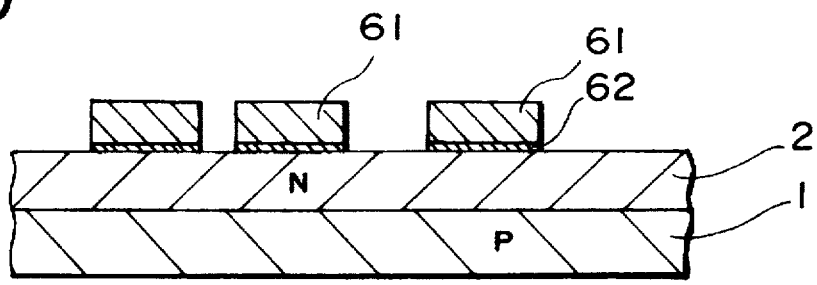

Then, as shown in FIG. 7D, a photoresist (not shown) is applied over the entire surface, and this photoresist is patterned into a pattern of gate electrodes. With the photoresist thus patterned as a mask, the polycrystal silicon film 8 and the gate oxide film 62 are selectively etched off, so that the gate electrodes 61 is formed of the polycrystal silicon film 8. After that, the photoresist is removed.

Figure 7E:
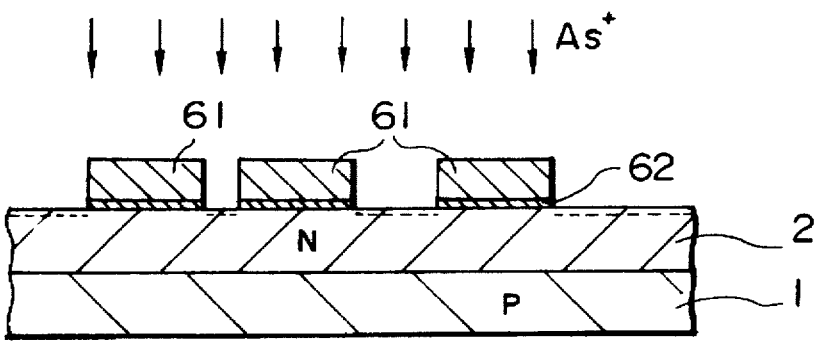

As the next step, as shown in FIGS. 7E and 4C, the photoresist 13 is applied over the entire surface. This photoresist is patterned into a pattern of the region 40 shown in FIG. 5A in such a manner as to cover the region formed with the contact hole 25c. Using the field oxide films 5a, 5b and the photoresist 13 thus patterned as a mask, N-type impurities of arsenic, for example, are ion-implanted into the N-type well 2 with an acceleration voltage of 40 keV and a dose of about $5\times10^{16}/cm^2$. In the process, the N-type impurities ion-implanted are diffused due to subsequent heat treatment and thereby form the source diffusion layers 15a, 15b, the drain diffusion layers 16a, 16b and the high-concentration N-type contact diffusion layer 30 of each memory cell.

Figure 7F:
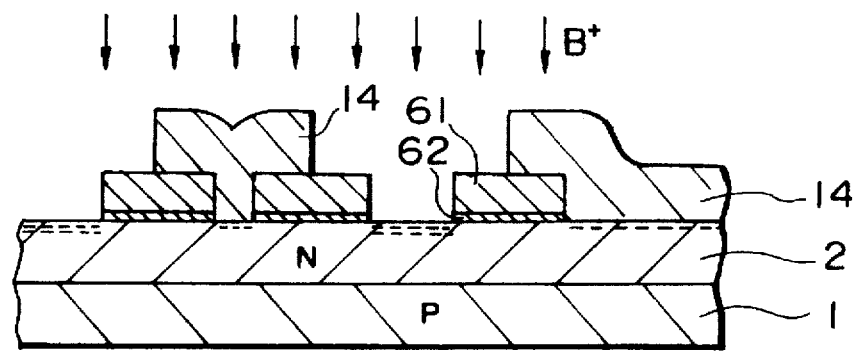

Next, as shown in FIGS. 7F and 4D, the photoresist 13 is removed, after which the photoresist 14 is applied over the entire surface. This photoresist 14 is patterned into a pattern excluding the region 41 shown in FIG. 5A, i.e., into a pattern exposing one of two regions of the N-type well 2 disposed at both sides of the gate electrode. With the field oxide films 5a, 5b and the photoresist thus patterned used as a mask, P-type impurities like boron are ion-implanted into the N-type well 2 with an acceleration voltage of about 20 keV and a dose of about $5\times10^{14}/cm^2$. In the process, the P-type impurities thus ion-implanted are diffused by subsequent heat treatment, thereby forming the high-concentration P-type contact diffusion layer 29 and the channel diffusion layers 17a, 17b surrounding the drain diffusion layers 16a, 16b respectively of each memory cell. After that, the photoresist 14 is removed.

Figure 7G:
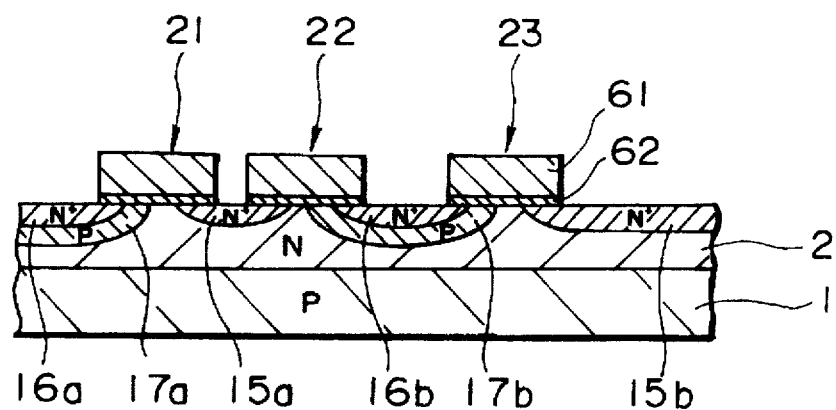

Next, as shown in FIG. 7G, heat treatment is performed for about 30 minutes in a nitrogen environment of about 950° C. in temperature, for example, thereby diffusing the arsenic and boron ion-implanted into the N-type well 2 of the element region. In the process, diffusion of the arsenic ion-implanted in the process of FIG. 7E forms the source diffusion layer 15a shared between the memory cells 21 and 22, the source diffusion layer 15b of the memory cell 23, the drain diffusion layer 16a of the memory cell 21, the drain diffusion layer 16b shared between the memory cells 22 and 23, and the high-concentration N-type contact diffusion layer 30. Since the diffusion coefficient of boron is considerably larger than that of arsenic, on the other hand, diffusion of boron forms the high-concentration P-type contact diffusion layer 29 and the P-type channel diffusion layers 17a, 17b surrounding the drain diffusion layers 16a, 16b respectively.

Also, the ion implantation of boron performed in the process of FIG. 7B increases the impurities concentration of the P-type impurities of the channel diffusion layer 17b to a level relatively high at its side close to the memory cell 22 and decreases them to a level relatively low at its other side closer to the memory cell 23, while decreasing the concentration of the P-type impurities of the channel diffusion layer 17a to a level relatively low at its side closer to the memory cell 21. Consequently, the threshold voltage of the memory cells 21, 23 is decreased to a relatively low level, while the threshold voltage of the memory cell 22 is increased to a relatively high level.

Further, the drain diffusion layers 16a, 16b, which are formed by self-alignment with respect to the gate electrode 61, are electrically isolated from the N-type well 2 by means of the channel diffusion layers 17a, 17b. In the process, the range in which the channel diffusion layers 17a, 17b are formed is dependent to a large measure on the difference in diffusion coefficient between arsenic and boron and the heat treatment conditions at the time of diffusion. This range, therefore, can be regulated substantially independently of the processing dimensions or accuracy of the gate electrode 61. The channel diffusion layers 17a, 17b and the high-concentration P-type contact diffusion layer 29 formed at this time are integrated by being brought into contact with the channel-connecting diffusion layers 6a, 6b formed in the process of FIG. 4B.

After that, the channel metal wiring 27 and the voltage control circuit 51 are connected, and similar processes to the first embodiment are otherwise performed, thereby completing the mask ROM shown in FIG. 5A.

As described above, according to the present embodiment, the channel diffusion layers 17a, 17b, 17c, the high-concentration P-type channel-connecting diffusion layers 6a, 6b and the high-concentration P-type contact diffusion layer 29 are extended and continuously formed in the N-type well 2. The P-type impurities diffusion layers thus continuously formed are connected to the channel metal line 27 through the contact hole 25c at the high-concentration P-type contact diffusion layer 29 constituting an extension from each memory cell. The channel diffusion layers 17a, 17b are thus connected electrically with the voltage control circuit 51. The potential of the channel diffusion layers 17a, 17b, 17c of the memory cells 21 to 23 and 31 to 33 thus becomes controllable independently of the substrate or the like without setting them in a floating mode. Variations of the threshold voltage otherwise caused among memory cells due to the punch-through occurring with the read operation can thus eliminated, and a highly reliable, stable operation is made possible.

Next, the read operation of the mask ROM according to the present embodiment will be described with reference to the memory cells 21 to 23 shown in FIG. 5B. In the explanation that follows, assume that data "0" is written in the memory cell 22 and data "1" in the memory cells 21, 23, i.e., that the threshold voltage of the memory cells 21, 23 is relative low and that of the memory cell 22 relatively high.

For the data stored in the memory cells 21 to 23 to be read out, a voltage larger than the threshold voltage of the memory cells 21, 23 and smaller than the threshold voltage of the memory cell 22 is applied to the gate electrode 61, while a voltage of 1 to 3 V is applied to the drain diffusion layers 16a, 16b, and 0 V is applied to the N-type well 2, the source diffusion layers 15a, 15b and the channel diffusion layers 17a, 17b. At the same time, whether the data written in the memory cells 21 to 23 is "0" or "1" is determined according to the presence or absence of the drain current at this particular time point.

According to the embodiment described above, the source diffusion layers 15a, 15b higher in concentration than the N-type well 2 are provided to form a source of high voltage-resistant structure. Instead of providing the source diffusion layer, however, only the N-type well 2 may be used to function as a source. Also, apart from the described case where the well (and the source diffusion layer) and the drain diffusion layer are of N type and the channel diffusion layer is of P type, the invention is applicable with equal effect to the case in which the well (and the source diffusion layer) and the drain diffusion layer are both of P type while the channel diffusion layer is of N type. Further, the invention can be applied also to an EEPROM having a selection transistor for each memory cell transistor.

Next, the third embodiment of the present invention will be explained with reference to FIGS. 9 and 10A to 10D. The third embodiment is different from the first and second embodiments in that in the third embodiment, an element-isolation electrode is used, in place of the element-isolation field oxide film, for electrically isolating element activating regions from each other.

Figure 9:
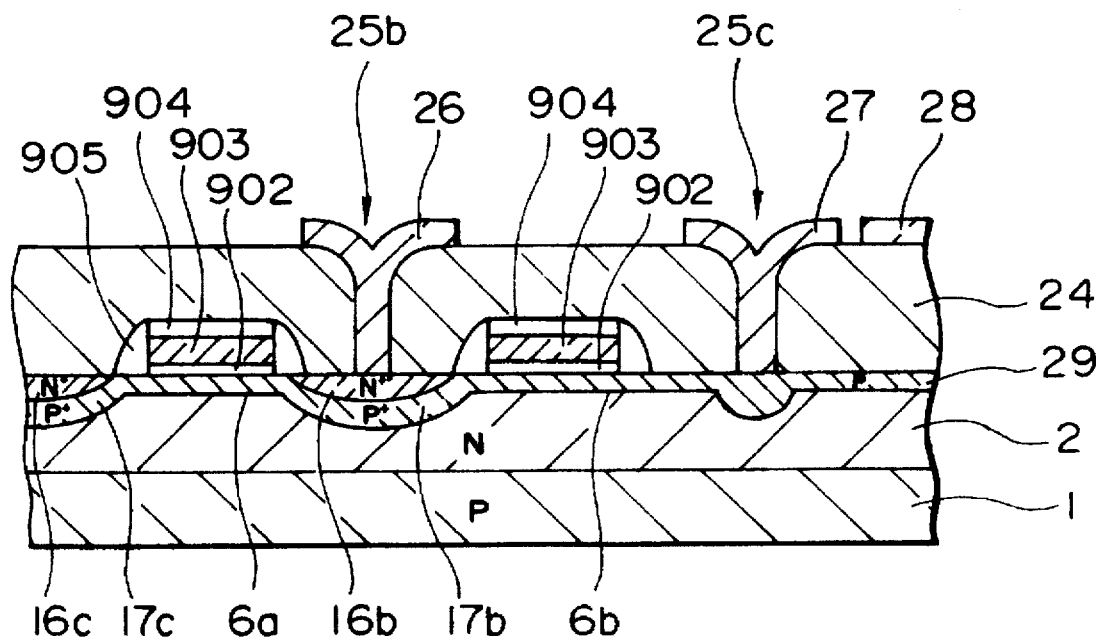
FIG. 9 shows a sectional view of the flash memory according to the third embodiment and correspondingly to FIG. 2A.

FIG. 9 shows a sectional view of the flash memory according to the third embodiment correspondingly to FIG. 2A showing the sectional view of the first embodiment and the same or similar elements as those in FIG. 2A are indicated by the same reference numerals. As shown in FIG. 9, in the third embodiment, an element-isolation gate structure is formed, in place of the field oxide film 5a in FIG. 2A, to include an insulating film 902 formed on the semiconductor substrate 1, an element-isolation gate 903 formed thereon and a cap insulating film 904 and sidewall insulating films 905 formed to cover the upper surface and the side walls of the element-isolation electrode. Then, the P-type channel diffusion layer 17b is connected to the high-concentration P-type contact diffusion layer 29 through an extension 6b of the channel diffusion layer 17b extending in the surface of the semiconductor substrate at an area beneath the element-isolation electrode 903.

Next, the method of fabricating a flash memory of the third embodiment will be explained with reference to FIGS. 10A to 10D.

Figure 10A:
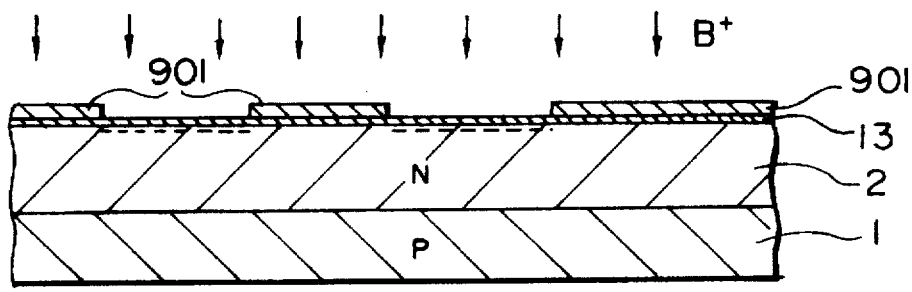
FIGS. 10A to 10D show the sectional views corresponding to FIGS. 4A to 4D at the respective steps in the method of fabricating the flash memory of the third embodiment.

First, as shown in FIG. 10A, N-type impurities such as phosphorus are ion-implanted into the P-type silicon substrate 1 at an acceleration voltage of about 50 kev and a dose of about $1 \times 10^{13}/cm^2$. Thereafter, heat treatment is carried out at a temperature of about 1050° C. within a nitrogen environment for about six hours, thereby forming an N well 2 in the surface of the silicon substrate 1.

Next, as shown in FIG. 10A, a silicon oxide film 3 is formed at a film thickness of about 20 nm on the N well and a resist film 901 is formed on the silicon oxide film. Then, the resist film 901 is selectively patterned so as to retain the resist film 901 only at areas where element activating regions are to be formed. Then, by using the resist film 901 as a mask, P-type impurities such as boron are ion-implanted into the N well 2 at an acceleration voltage of about 20 kev and a dose of about $1 \times 10^{15}/cm^2$. Then the resist film 901 is removed.

Figure 10B:
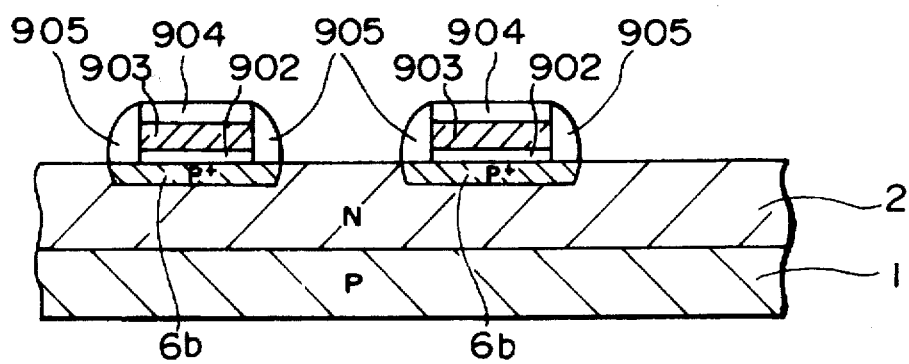
Figure 10C:
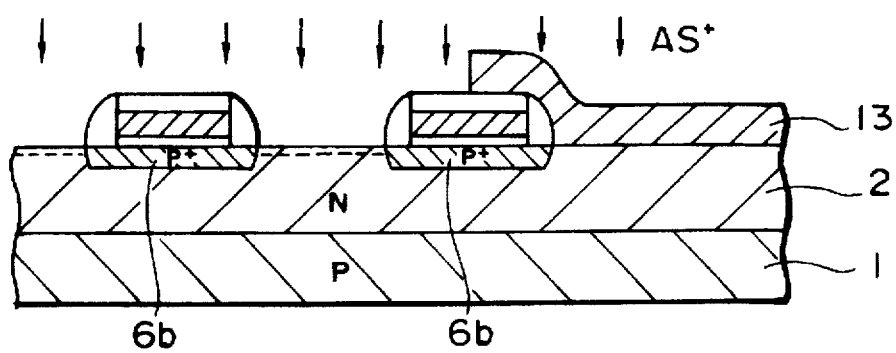
Figure 10D:
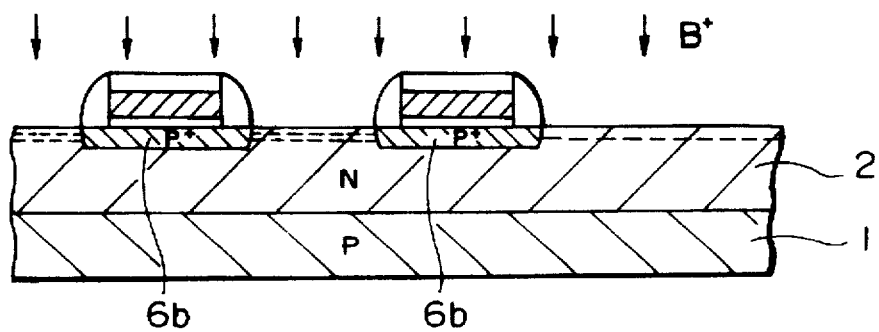

By applying heat treatment to the P-type silicon substrate 1, high-concentration P-type channel connection diffusion layers 6a and 6b are formed as shown in FIG. 10B. Then, a silicon oxide film 902 is formed on the N well 2 by the thermal oxidation method and thereafter, a polycrystal silicon film 903 containing impurities and a silicon oxide film 902 are deposited in that order on the silicon oxide film 902 by the CVD method. Next, the silicon oxide film 904, the polycrystal silicon film 903 and the silicon oxide film 902 are successively patterned so that the silicon oxide film 902, the polycrystal silicon film 903 and the silicon oxide film 904 are retained only above the high-concentration P-type channel connection diffusion layers 6a and 6b. The polycrystal silicon film 903 provides an element-isolation electrode which defines at both sides thereof two element activation regions electrically isolated from each other.

Further, after a silicon oxide film 905 is entirely deposited on the N well 2 by the CVD method, an anisotropic etching is applied to the silicon oxide film 905 so as to retain the silicon oxide film 905 only on side walls of the silicon oxide film 902, polycrystal silicon film 903 and the silicon oxide film 904. Thus, the sidewall silicon oxide films 905 are formed.

Next, after a photoresist 13 is coated on the whole surface of the substrate, the photoresist 13 is patterned into a pattern of the region 40 as shown in FIG. 1A, i.e. a pattern covering the areas where the contact holes 25c are formed. Then, by using this photoresist as a mask, N-type impurities such as arsenic are ion-implanted into the N well 2 at an acceleration voltage of about 40 kev and a dose of about $1\times10^{15}$/cm$^2$. The ion-implanted N-type impurities are diffused by the subsequent thermal treatment to form the source diffusion layers 15a and 15b, the drain diffusion layers 16a and 16b and the high concentration N-type contact diffusion layer 30 of each memory cell. Incidentally, when the N-type impurities of phosphorus are ion-implanted at the same ion-implantation condition, the impurities are more deeply introduced.

Next, after the photoresist 13 is removed, another photoresist 14 is coated on the whole surface of the substrate. The photoresist 14 is then patterned to a pattern excluding the regions 41 as shown in FIG. 1A, i.e. a pattern so as to cause one of two regions of the N well 2 disposed at both sides of each control gate to expose. By using this photoresist 14 and the element-isolation electrodes 903 as a mask, P-type impurities such as boron are ion-implanted into the N well 2 at an acceleration voltage of about 20 kev and a dose of about $5\times10^{14}$/cm$^2$. The implanted impurities are diffused by the subsequent thermal treatment to form the channel diffusion layers 17a and 17b surrounding the drain diffusion layers 16a and 16b and the high concentration P-type contact layer 29 for the respective memory cells. Then, the photoresist 14 is removed.

It will thus be understood from the foregoing description that according to the present invention the potential of the channel region of a memory cell transistor of DSA type is controllable, and therefore the channel region is prevented from being floated. For this reason, the threshold voltage level is not subjected to variations when performing the read or rewrite operation, thereby leading to a stable operation. Also, in view of the fact that the effective channel length of each memory cell can be controlled according to the lateral diffusion length of impurities, variations of the effective channel length which otherwise would be caused by the processing limitation of the floating gate are prevented even when the memory cell size is reduced. Consequently, high integration is possible, and variations are minimized in the memory cell characteristics including the drain current and the threshold voltage for data read operation and the write characteristic for data write operation. It is therefore possible to realize a highly reliable nonvolatile semiconductor memory device high in the ratio of good products.

I claim:

1. A nonvolatile semiconductor memory device comprising:

a semiconductor substrate;

a transistor formed on said semiconductor substrate, including a gate structure formed on a region of the surface of said substrate, a pair of mutually-isolated impurities diffusion layers of first conduction type formed on the two sides of said gate structure on the surface of said semiconductor substrate, and a second impurities diffusion layer of second conduction type different from the first conduction type, formed in such a manner as to cover the substrate's side of at least one of said first impurities diffusion layers, said second impurities diffusion layer having a terminal section reaching a region of the surface of said semiconductor substrate, said second impurities diffusion layer forming the channel region of said transistor; and a conduction layer electrically connected to said second impurities diffusion layer and formed accessibly externally.

2. A nonvolatile semiconductor memory device according to claim 1, wherein said second impurities diffusion layer has an extension to the surface of said semiconductor substrate, and said conduction layer is formed on an interlayer insulating film formed on said semiconductor substrate in such a manner as to cover said transistor, said conduction layer being connected to said extension of said second impurities diffusion layer through a contact hole formed in said interlayer insulating film.

3. A nonvolatile semiconductor memory device according to claim 2, further comprising at least one elongated element-isolating field oxide film formed on said semiconductor substrate in order to define at least two electrically-isolated element-activating regions on said semiconductor substrate, wherein said transistor is formed on one of said two element-activating regions, and the extension of said second impurities diffusion layer passes under said field oxide film and extends to the other of said two element-activating regions.

4. A nonvolatile semiconductor memory device according to claim 1, wherein said first conductivity type is N-type and said second conductivity type is P-type.

5. A nonvolatile semiconductor memory device according to claim 2, further comprising at least one elongated element-isolation electrode formed on the semiconductor substrate for defining element activating regions electrically isolated from each other in the semiconductor substrate at both sides of the element-isolation electrode, and wherein said transistor is formed in one of said element activating regions and said extension of said second impurity diffusion layer extends beneath the element-isolation electrode into the other element activating region.

6. A nonvolatile semiconductor memory device according to claim 1, wherein said semiconductor substrate is the first conduction type.

7. A nonvolatile semiconductor memory device comprising:

a semiconductor substrate of first conduction type;

at least a memory cell transistor formed on said semiconductor substrate, including a stacked gate structure having a floating gate formed on a predetermined region of the surface of said semiconductor substrate through a first insulating film and a control gate formed on said floating gate through a second insulating film, a pair of mutually-isolated first impurities diffusion layers of first conduction type formed on the two sides of said gate structure on the surface of said semiconductor substrate and having a resistance lower than said semiconductor substrate, and a second impurities diffusion layer of second conduction type different from said first conduction type, said second impurities diffusion layer being formed in such a manner as to surround one of said two first impurities diffusion layers in said semiconductor substrate and having a terminal section reaching a predetermined region on the surface of said semiconductor substrate thereby to form the channel region of said transistor;

an extension of said second impurities diffusion layer extending in said semiconductor substrate; and a conduction layer electrically connected to said extension and accessible externally.

8. A nonvolatile semiconductor memory device according to claim 7, further comprising at least one elongated element-isolation electrode formed on the semiconductor substrate for defining element activating regions electrically isolated from each other in the semiconductor substrate at both sides of the element-isolation electrode, and wherein said transistor is formed in one of said element activating regions and said extension of said second impurity diffusion layer extends beneath the element-isolation electrode into the other element activating region.

9. A nonvolatile semiconductor memory device according to claim 7, wherein said first conductivity type is N-type and said second conductivity type is P-type.

10. A nonvolatile semiconductor memory device according to claim 7, wherein said conduction layer is formed on an interlayer insulating layer formed on said semiconductor substrate in such a manner as to cover said memory transistor, said conduction layer being connected to said extension of said second impurities diffusion layer through a contact hole formed in said interlayer insulating film.

11. A nonvolatile semiconductor memory device according to claim 7, further comprising at least an elongated element-isolating field oxide film formed on said semiconductor substrate in order to define at least two electrically-isolated element-activating regions on said semiconductor substrate, said transistor being formed on one of said two element-activating regions, the extension of said second impurities diffusion layer passing under said field oxide film and extending to the other of the two element-activating regions.

12. A nonvolatile semiconductor memory device comprising:

a first semiconductor substrate of first conduction type;

at least a memory cell transistor formed on said semiconductor substrate, each including a gate electrode formed on a predetermined region of the surface of said semiconductor substrate through an insulating film, a pair of first impurities diffusion layers of first conduction type formed in isolated relation to each other on the two sides of said gate electrode on the surface of said semiconductor substrate and having a resistance lower than said semiconductor substrate, and a second impurities diffusion layer of second conduction type different from said first conduction type, formed in such a manner as to surround one of said first impurities diffusion layers in said semiconductor substrate and having a terminal section reaching a predetermined region of the surface of said semiconductor substrate, thereby forming the channel region of said transistor;

an extension of said second impurities diffusion layer extending in said semiconductor substrate; and a conduction layer electrically connected to said extension and formed accessible externally.

13. A nonvolatile semiconductor memory device according to claim 12, further comprising at least one elongated element-isolation electrode formed on the semiconductor substrate for defining element activating regions electrically isolated from each other in the semiconductor substrate at both sides of the element-isolation electrode, and wherein said transistor is formed in one of said element activating regions and said extension of said second impurity diffusion layer extends beneath the element-isolation electrode into the other element activating region.

14. A nonvolatile semiconductor memory device according to claim 12, wherein said conduction layer is formed on an interlayer insulating film formed on said semiconductor substrate in such a manner as to cover said memory transistor, said conduction layer being connected to said extension of said second impurities diffusion layer through a contact hole formed in said interlayer insulating film.

15. A nonvolatile semiconductor memory device according to claim 12, further comprising at least one elongated element-isolating field oxide film formed on said semiconductor substrate in order to define at least two electrically-isolated element-activating regions on said semiconductor substrate, at least one of said transistors being formed on one of said two element-activating regions, the extension of said second impurities diffusion layer passing under said field oxide film and extending to the other of said two element-activating regions.

* * * * *